United States Patent
Lin

(10) Patent No.: US 11,404,334 B1
(45) Date of Patent: Aug. 2, 2022

(54) TESTING CIRCUIT WITH SHARED TESTING PADS LOCATED ON THE SCRIBE LINE AND TESTING METHOD THEREOF

(71) Applicant: Winbond Electronics Corp., Taichung (TW)

(72) Inventor: Chih-Feng Lin, Hsinchu County (TW)

(73) Assignee: WINDBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 17/342,066

(22) Filed: Jun. 8, 2021

(51) Int. Cl.
*H01L 21/66* (2006.01)
*G01R 31/28* (2006.01)

(52) U.S. Cl.
CPC .......... *H01L 22/34* (2013.01); *G01R 31/2884* (2013.01)

(58) Field of Classification Search
CPC .............................. H01L 22/34; G01R 31/2884
USPC ...................................... 324/750.3, 537, 500
See application file for complete search history.

(56) References Cited

U.S. PATENT DOCUMENTS

| | | | | |
|---|---|---|---|---|
| 5,981,971 A | 11/1999 | Miyakawa | | |
| 7,960,984 B2 * | 6/2011 | Choi | ...................... | H01L 23/60 324/762.01 |
| 8,278,952 B2 * | 10/2012 | Tseng | ............... | G01R 31/31721 324/762.01 |
| 10,768,223 B2 * | 9/2020 | Kim | .................. | G11C 29/56008 |
| 2006/0152236 A1 * | 7/2006 | Kim | ........................ | G11C 29/50 324/750.3 |
| 2012/0278027 A1 * | 11/2012 | Jindal | ............... | G01R 31/31715 702/118 |
| 2016/0197606 A1 * | 7/2016 | Yoon | ................ | G01R 31/31715 327/109 |

FOREIGN PATENT DOCUMENTS

JP  61-125040 A  6/1986

* cited by examiner

*Primary Examiner* — Giovanni Astacio-Oquendo
(74) *Attorney, Agent, or Firm* — Birch, Stewart, Kolasch & Birch, LLP

(57) ABSTRACT

A testing circuit includes a command pad, a first circuit, a second circuit, a first latch, and a second latch. The command pad receives an operation command. The first integrated circuit performs a corresponding test operation according to the operation command and an internal selection signal. The second integrated circuit performs the corresponding test operation according to the operation command and an internal selection signal. The first latch provides the operation command to the first integrated circuit according to the internal selection signal. The second latch provides the operation command to the second integrated circuit according to the internal selection signal.

20 Claims, 10 Drawing Sheets

TESTING CIRCUIT WITH SHARED TESTING PADS LOCATED ON THE SCRIBE LINE AND TESTING METHOD THEREOF

BACKGROUND OF THE INVENTION

Field of the Invention

The disclosure is generally related to a testing circuit and a testing method thereof, and more particularly it is related to a testing circuit with shared testing pads located on the scribe line and a testing method thereof.

Description of the Related Art

When the semiconductor components are fabricated, it will be verified whether these semiconductor components have certain expected characteristics or values, such as specific gain, resistance value, capacitance value, etc. This quality control method is called wafer acceptance testing. Sometimes it is also required to program and test certain semiconductor components on the wafer before the wafer is cut into chips. Therefore, how to configure the testing pads to ensure that the testing pads will not affect the characteristics of the semiconductor components will become an important issue.

BRIEF SUMMARY OF THE INVENTION

Testing circuits and testing methods thereof are provided herein. All pads that are required for testing are located on the scribe line so as to reduce the influence of the testing pads on the normal operation of the integrated circuits. In addition, a latch is inserted into the command pad and each integrated circuit, thereby transmitting the operation command to the corresponding integrated circuit through enabling the latch. Therefore, a plurality of integrated circuits are able to share a common command pad so as to reduce the number of pads required for testing. Furthermore, a plurality of integrated circuits may share the same power pads and data pads, further reducing the number of pads required for testing.

In an embodiment, a testing circuit is provided, which comprises a command pad, a first integrated circuit, a second integrated circuit, a first latch, and a second latch. The command pad receives an operation command. The first integrated circuit performs a corresponding testing operation according to the operation command and an internal selecting signal. The second integrated circuit performs the corresponding testing operation according to the operation command and the internal selecting signal. The first latch provides the operation command to the first integrated circuit according to the internal selecting signal. The second latch provides the operation command to the second integrated circuit according to the internal selecting signal. The first latch, and the second latch are located on the scribe line between the first integrated circuit and the second integrated circuit.

According to an embodiment of the invention, the testing circuit further comprises a testing pad, an external selecting pad, and a controller. The testing pad receives a testing signal. The external selecting pad receives an external selecting signal. The controller decodes the external selecting signal into the internal selecting signal according to the testing signal.

According to an embodiment of the invention, when the testing signal transitions from a first state to a second state, the controller resets the internal selecting signal. When the testing signal transitions from the second state to the first state, the controller decodes the external selecting signal into the internal selecting signal. The internal selecting signal is configured to select the first integrated circuit or the second integrated circuit to perform the corresponding operation, and the latch provides a deep-power-down command received by the command pad to the first integrated circuit according to the internal selecting signal generated by the controller so as to operate the first integrated circuit in a deep-power-down mode. When the first integrated circuit operates in the deep-power-down mode, the controller provides a testing command received by the command pad to the second integrated circuit according to the external selecting signal so that the second integrated circuit performs the corresponding testing operation according to the testing command. The first state is a low voltage level, and the second state is a high voltage level. The testing pad and the controller are located on a scribe line between the first integrated circuit and the second integrated circuit.

According to an embodiment of the invention, the testing circuit further comprises a plurality of power pads. The power pads that receive power are coupled to the first integrated circuit and the second integrated circuit, and are configured to power the first integrated circuit and the second integrated circuit. Each of the power pads is located on a scribe line between the first integrated circuit and the second integrated circuit. The testing circuit further comprises a plurality of data pads. The data pads are coupled to the first integrated circuit and the second integrated circuit. They are configured to transmit data to the first integrated circuit or the second integrated circuit, and to receive the data transmitted from the first integrated circuit or the second integrated circuit. Each of the data pads is located on a scribe line between the first integrated circuit and the second integrated circuit.

In another embodiment, a testing method adapted to test a first integrated circuit and a second integrated circuit is provided. The method comprises selecting the first integrated circuit; operating the first integrated circuit in a deep-power-down mode; selecting the second integrated circuit; and performing a corresponding testing operation on the second integrated circuit, the step of selecting the second integrated circuit and the step of selecting the first integrated circuit further comprise receiving a testing signal through a testing pad; receiving an external selecting signal through an external selecting pad; decoding the external selecting signal into the internal selecting signal according to the testing signal; and selecting the first integrated circuit or the second integrated circuit, according to the internal selecting signal.

According to an embodiment of the invention, the testing pad is located on a scribe line between the first integrated circuit and the second integrated circuit.

According to an embodiment of the invention, the step of decoding the external selecting signal into the internal selecting signal according to the testing signal further comprises when the testing signal transitions from a first state to a second state, resetting the internal selecting signal; and when the testing signal transitions from the second state to the first state, decoding the external selecting signal into the internal selecting signal, wherein, the first state is a low voltage level and the second state is a high voltage level.

According to an embodiment of the invention, the step of operating the first integrated circuit in the deep-power-down mode further comprises receiving, by a command pad, a deep-power-down command; providing, by a first latch, the deep-power-down command to the first integrated circuit according to the internal selecting signal; and operating the first integrated circuit in the deep-power-down mode according to the deep-power-down command.

According to an embodiment of the invention, the step of performing a corresponding testing operation on the second integrated circuit further comprises receiving, by the command pad, the testing command; providing, by a second latch, the testing command to the second integrated circuit according to the internal selecting signal; and performing a corresponding testing operation on the second integrated circuit according to the testing command, the command pad, the first latch, and the second latch are located on a scribe line between the first integrated circuit and the second integrated circuit. The testing method further comprises receiving a power by a plurality of power pads, wherein the power pads are coupled to the first integrated circuit and the second integrated circuit and located on a scribe line between the first integrated circuit and the second integrated circuit; and powering the first integrated circuit and the second integrated circuit with the power. The testing method further comprises transmitting data, from a plurality of data pads, to the first integrated circuit or the second integrated circuit; and receiving data, by the data pads, transmitted from the first integrated circuit or the second integrated circuit, wherein each of the data pads is coupled to the first integrated circuit and the second integrated circuit and located on a scribe line between the first integrated circuit and the second integrated circuit.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

Figure 1:
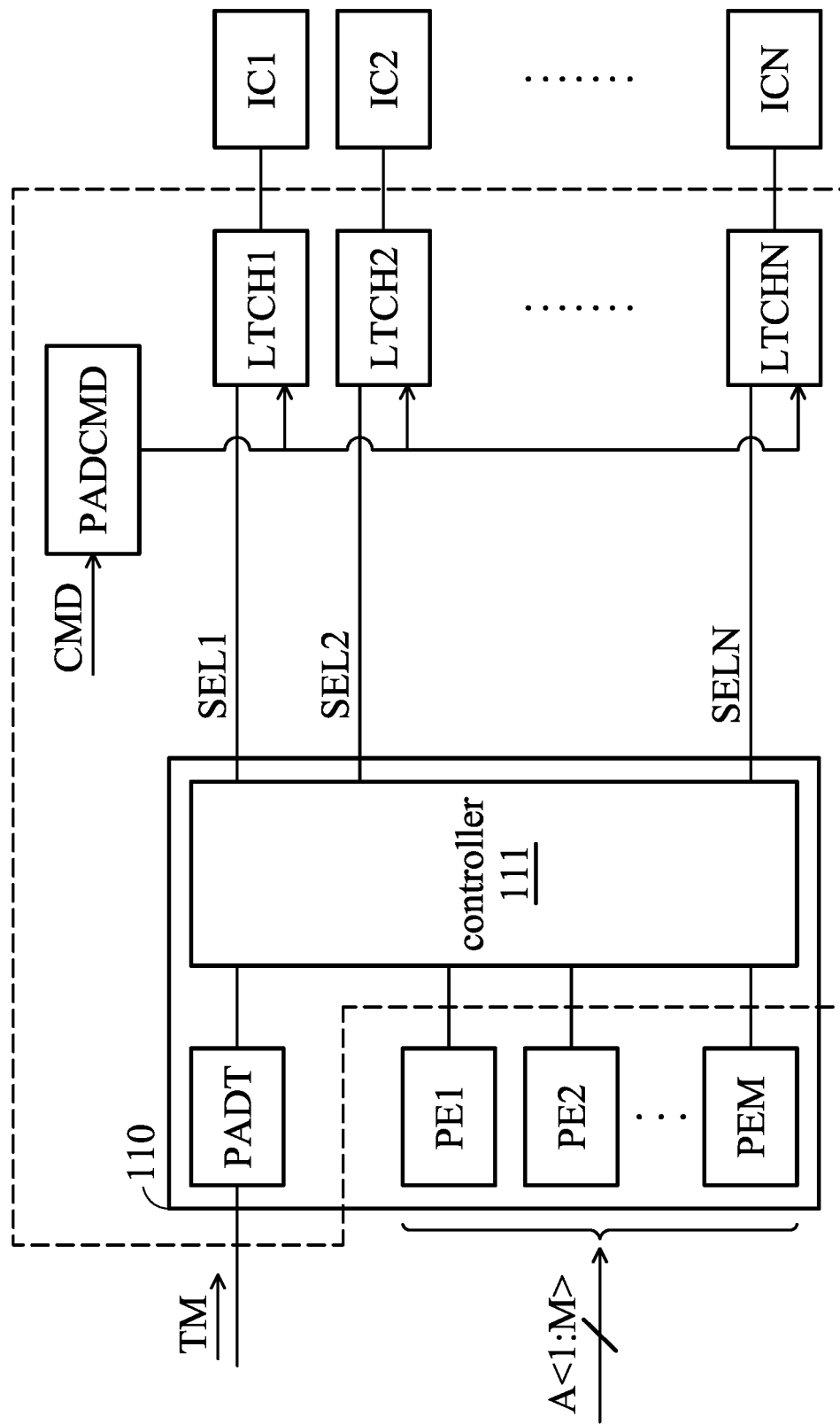
FIG. 1 is a block diagram of a testing circuit in accordance with an embodiment of the invention.

This description is made for the purpose of illustrating the general principles of the invention and should not be taken in a limiting sense. In addition, the present disclosure may repeat reference numerals and/or letters in the various examples. This repetition is for the purpose of simplicity and clarity and does not in itself dictate a relationship between the various embodiments and/or configurations discussed. The scope of the invention is best determined by reference to the appended claims.

FIG. 1 is a block diagram of a testing circuit in accordance with an embodiment of the invention. As shown in FIG. 1, the testing circuit 100 includes a signal generating circuit 110, in which the signal generating circuit 110 includes a testing pad PADT, a first external selecting pad PE1, a second external selecting pad PE2, . . . , a M-th external selecting pad PEM, and a controller 111. The testing pad PADT is configured to receive the testing signal TM. The first external selecting pad PE1, the second external selecting pad PE2, . . . , and the M-th external selecting pad PEM receive the external selecting signals A<1:M> respectively. The controller 111 decodes the external selecting signals A<1:M> into a first internal selecting signal SEL1, a second internal selecting signal SEL2, . . . , and an N-th internal selecting signal SELN, according to a testing signal TM.

The testing circuit 100 further includes a command pad PADCMD, a first latch LTCH1, a second latch LTCH2 . . . an N-th latch LTCHN, a first integrated circuit IC1, a second integrated circuit IC2 . . . and an N-th integrated circuit ICN. The command pad PADCMD receives an operation command CMD. The first latch LTCH1, the second latch LTCH2 . . . and the N-th latch LTCHN provide the operation command CMD received by the command pad PADCMD to the first integrated circuit IC1, the second integrated circuit IC2 . . . and the N-th integrated circuit ICN respectively.

According to an embodiment of the invention, in order to prevent the normal operations of the first integrated circuit IC1, the second integrated circuit IC2, . . . , and the N-th integrated circuit ICN being interfered by the testing circuit 100, the testing pad PADT, the controller 110, the command pad PADCMD, the first latch LTCH1, the second latch LTCH2, . . . , and the N-th latch LTCHN are located on the scribe line among the first integrated circuit IC1, the second integrated circuit IC2 . . . and the N-th integrated circuit ICN. In other words, when the first integrated circuit IC1, the second integrated circuit IC2, . . . , and the N-th integrated circuit ICN are cut into chips from a wafer, the testing pad PADT, the controller 110, the command pad PADCMD, the first latch LTCH1, the second latch LTCH2 . . . and the N-th latch LTCHN are cut off as well.

According to some embodiments of the invention, the first integrated circuit IC1, the second integrated circuit IC2 . . . and the N-th integrated circuit ICN may be memory circuits, or any type of integrated circuits that need to be tested. According to an embodiment of the invention, a first external selecting pad PE1, a second external selecting pad PE2 . . . and an M-th external selecting pad PEM are the pads already existed in the integrated circuit. According to another embodiment of the invention, the first external selecting pad PE1, the second external selecting pad PE2 . . . and the M-th external selecting pad PEM may be located on the scribe line 210. The testing circuit 100 will be fully explained in the following paragraphs.

Figure 2:
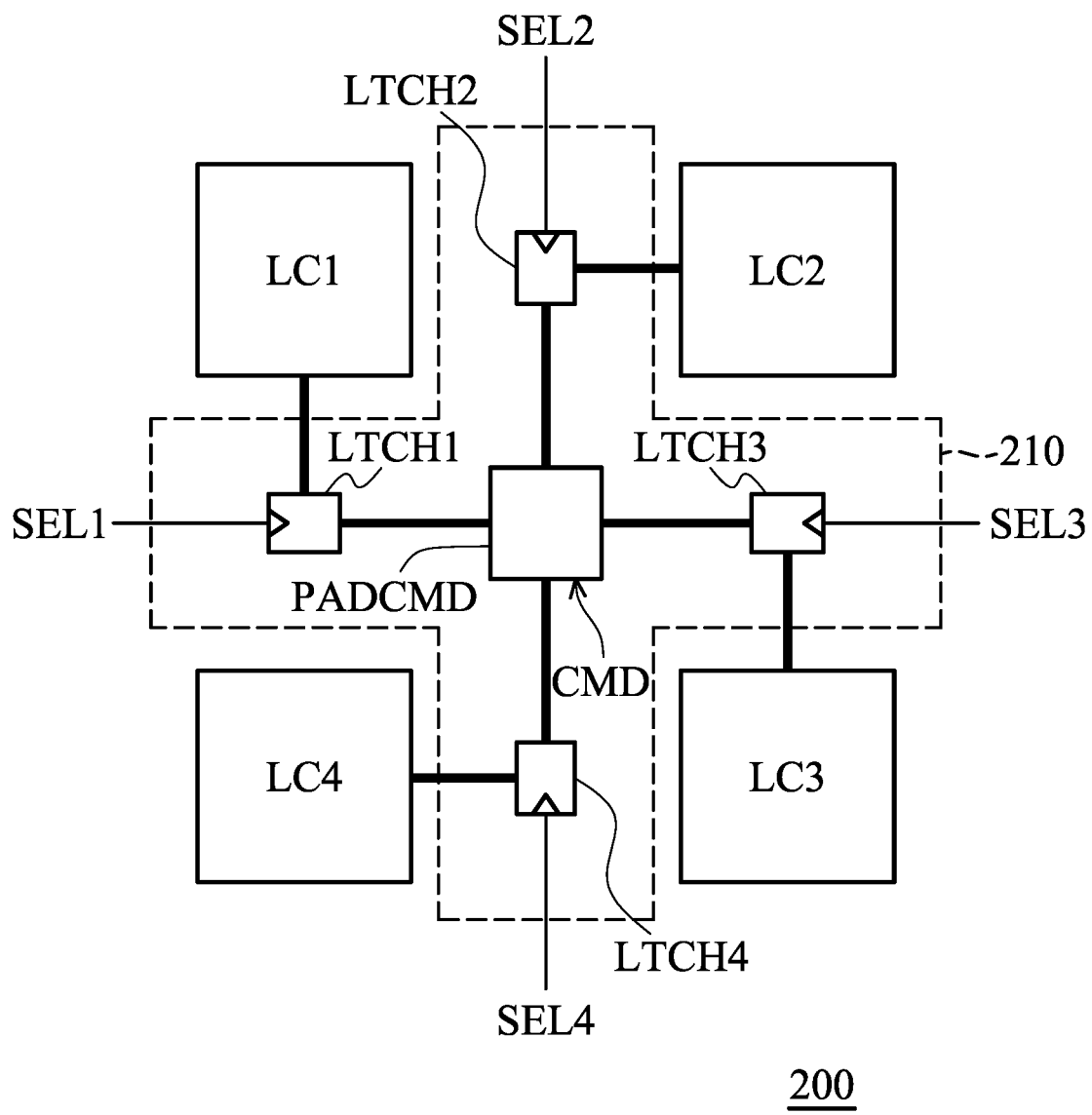
FIG. 2 is a schematic diagram of a testing circuit in accordance with an embodiment of the invention.

FIG. 2 is a schematic diagram of a testing circuit in accordance with an embodiment of the invention. As shown in FIG. 2, the testing circuit 200 includes a command pad PADCMD, a first latch LTCH1, a second latch LTCH2, a third latch LTCH3, a fourth latch LTCH4, a first integrated circuit IC1, a second integrated circuit IC2, a third integrated circuit IC3, and a fourth integrated circuit IC4. According to an embodiment of the invention, the testing circuit 200 is illustrated as 4 integrated circuits for explanation, but not intended to be limited thereto.

As shown in FIG. 2, there is a scribe line 210 among the first integrated circuit IC1, the second integrated circuit IC2, the third integrated circuit IC3, and the fourth integrated circuit IC4. The command pad PADCMD, the first latch LTCH1, the second latch LTCH2, the third latch LTCH3, and the fourth latch LTCH4 are located on the scribe line 210.

The first latch LTCH1 provides the operation command CMD received by the command pad PADCMD to the first integrated circuit IC1 according to the first internal selecting signal SEL1. The second latch LTCH2 provides the operation command CMD to the second integrated circuit IC2 according to the second internal selecting signal SEL2. The third latch LTCH3 provides the operation command CMD to the third integrated circuit IC3 according to the third internal selecting signal SEL3. The fourth latch LTCH4 provides the operation command CM to the fourth integrated circuit IC4 according to the fourth internal selecting signal SEL4.

Figure 3:
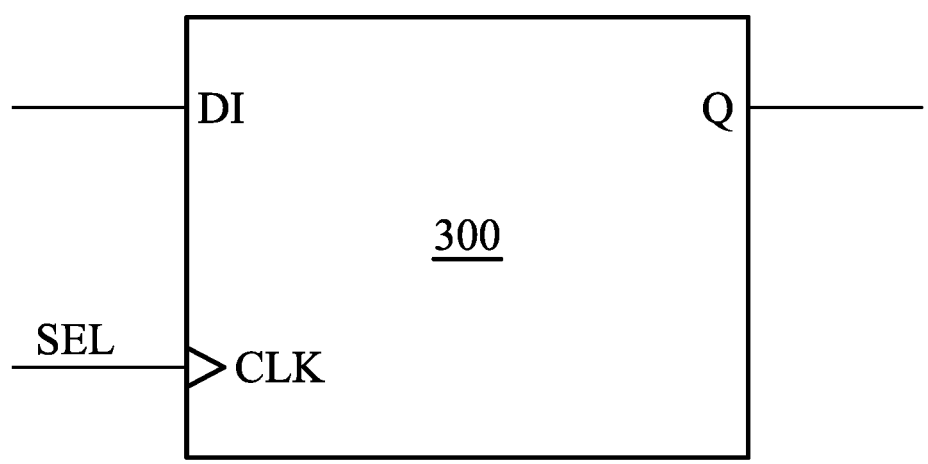
FIG. 3 is a schematic diagram of a latch in accordance with an embodiment of the invention.

FIG. 3 is a schematic diagram of a latch in accordance with an embodiment of the invention. As shown in FIG. 3, the latch 300 is a D flip-flop, in which the latch 300 includes an input terminal DI, a clock terminal CLK, and an output terminal Q. the clock terminal CLK receives an internal selecting signal SEL. According to an embodiment of the invention, the latch 300 corresponds to the first latch LTCH1, the second latch LTCH2, the third latch LTCH3, and the fourth latch LTCH4 in FIG. 2, and also corresponds to the first latch LTCH1, the second latch LTCH2 . . . and the N-th latch LTCHN in FIG. 1. In other words, the first latch LTCH1, the second latch LTCH2, the third latch LTCH3, and the fourth latch LTCH4 in FIG. 2 each may be a D flip-flop.

Figure 4:
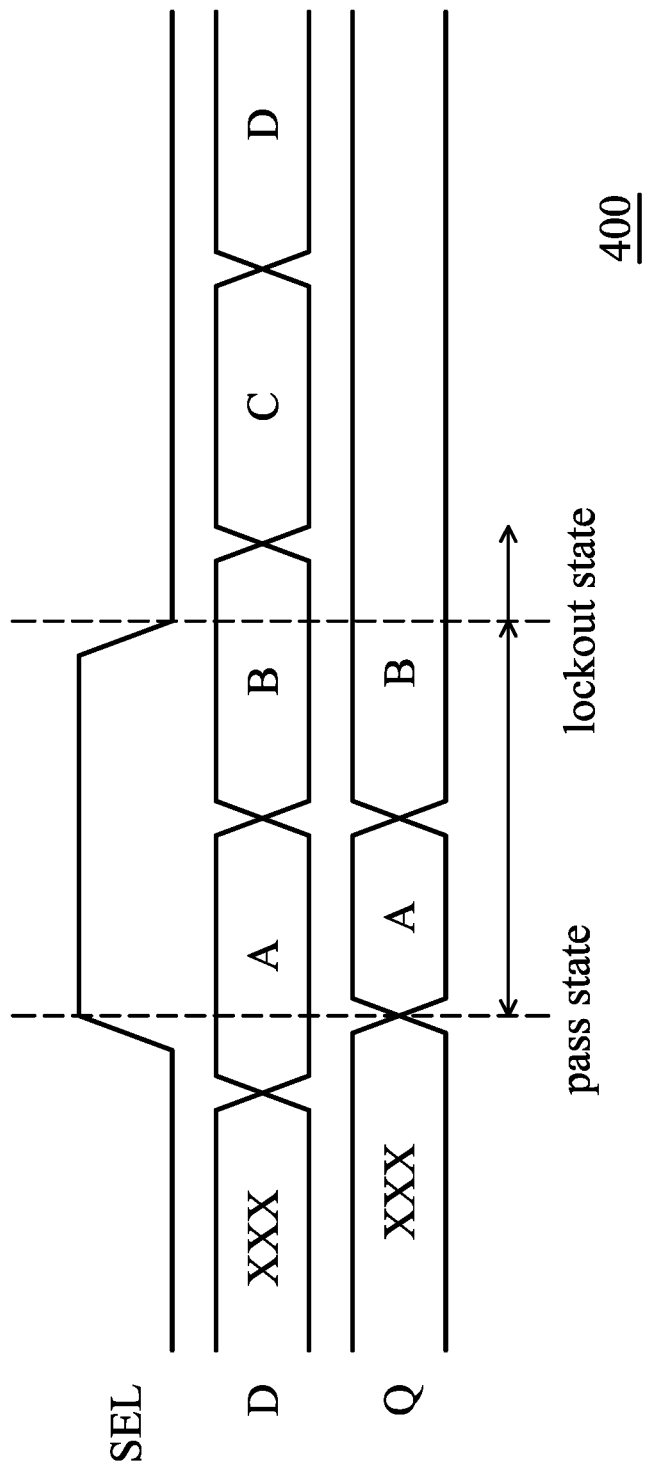
FIG. 4 is a timing diagram of a latch in accordance with an embodiment of the invention.

FIG. 4 is a timing diagram of a latch in accordance with an embodiment of the invention. As shown in FIG. 4, the timing diagram 400 is an operation timing diagram of the latch 300. The description of the timing diagram 400 will be fully explained with reference to FIG. 3.

When the clock terminal CLK of the latch 300 receives the internal selecting signal SEL transitioning from the low voltage level to the high voltage level, the latch 300 enters the pass state. As shown in FIG. 4, when the input terminal DI receives the first command A, the output terminal Q outputs the first command A as well. When the input terminal DI receives the second command B, the output terminal Q outputs the second command B as well.

When the internal selection signal SEL transitions from the high voltage level to the low voltage level, the latch 300 enters the lockout state. As shown in FIG. 4, when the clock terminal CLK of the latch 300 receives the internal selecting signal SEL transitioning from the high voltage level to the low voltage level, the input terminal DI receives the second command B and the output terminal Q outputs the second command B. Even though the input terminal DI receives the third command C or the fourth command D at the same time, the output terminal Q still outputs the second command B.

In other words, when one of the first internal selecting signal SEL1, the second internal selecting signal SEL2, the third internal selecting signal SEL3, and the fourth internal selecting signal SEL4 in FIG. 2 transitions from the low voltage level to the high voltage level or from the high voltage level to the low voltage level, only one of the first integrated circuit IC1, the second integrated circuit IC2, the third integrated circuit IC3, and the fourth integrated circuit IC4 receives the operation command CMD received by the command pad PADCMD.

Figure 5:
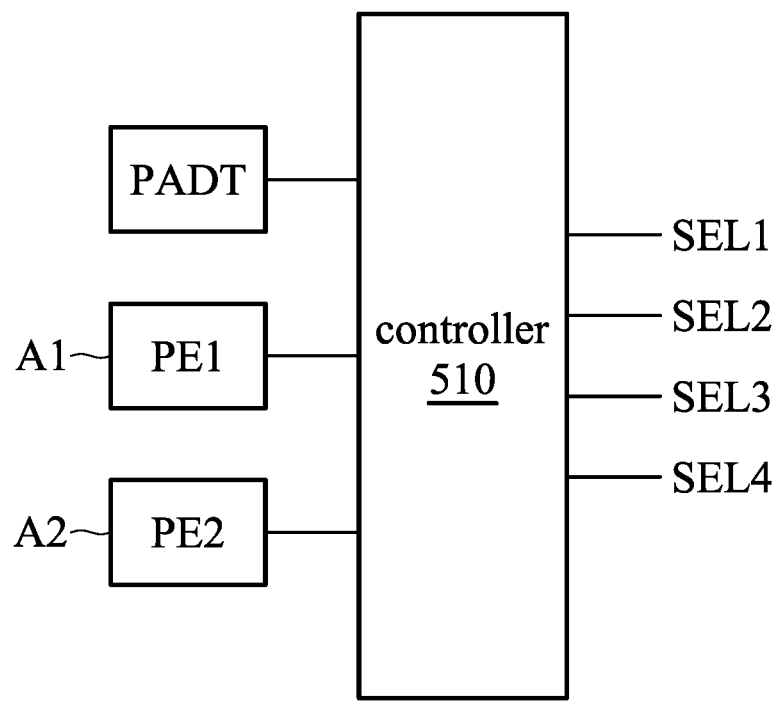
FIG. 5 is schematic diagram of a signal generating circuit in accordance with an embodiment of the invention.

FIG. 5 is schematic diagram of a signal generating circuit in accordance with an embodiment of the invention. As shown in FIG. 5, the signal generating circuit 500 includes a testing pad PADT, a first external selecting pad PE1, a second external selecting pad PE2, and a controller 510, in which the signal generating circuit 500 corresponds to the signal generating circuit 110 in FIG. 1, and the controller 510 corresponds to the controller 111 in FIG. 1. For the sake of fully explaining the operation of the signal selecting circuit 500, FIG. 5 is illustrated as 2 external selecting pads and 4 internal selecting signals for explanation, but not intended to be limited thereto.

The first external selecting pad PE1 receives the first external selecting signal A1, the second external selecting pad PE2 receives the second external selecting signal A1, the testing pad PADT receives the testing signal TM, and the controller 510, according to the testing signal TM, decodes the first external selecting signal A1 and the second external selecting signal A2 into the first internal selecting signal SEL1, the second internal selecting signal SEL2, the third internal selecting signal SEL3, and the fourth internal signal SEL4. The detailed mapping relationship of the external selecting signals A<2:1> to the internal selecting signals SEL<4:1> is shown as following table.

| TM = 1 | SEL<4:1> |
| --- | --- |
| A<2:1> = 00 | 0001 |
| A<2:1> = 01 | 0010 |
| A<2:1> = 10 | 0100 |
| A<2:1> = 11 | 1000 |

Figure 6:
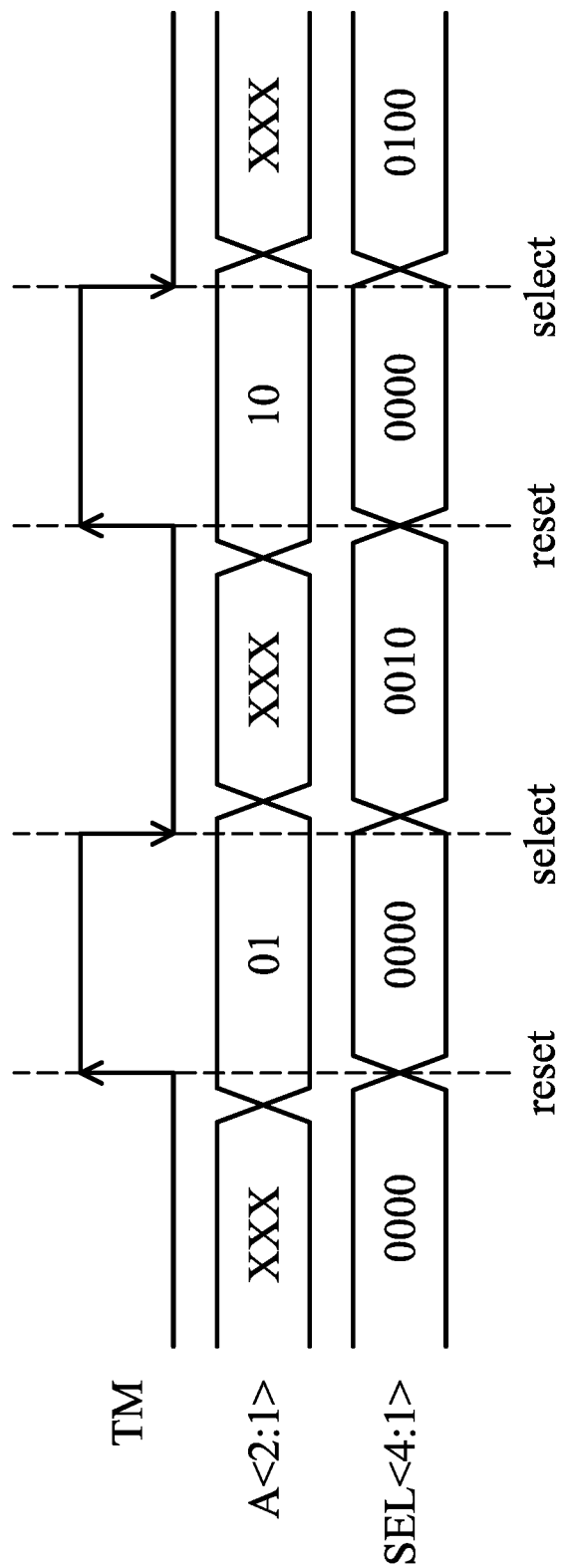
FIG. 6 is a timing diagram of a signal generating circuit in accordance with an embodiment of the invention.

FIG. 6 is a timing diagram of a signal generating circuit in accordance with an embodiment of the invention. As shown in FIG. 6, when the testing signal TM transitions from the low voltage level to the high voltage level, the controller 510 resets the internal selecting signals SEL<4:1>. That is, the first internal selecting signal SEL1, the second selecting signal SEL2, the third selecting signal SEL3, and the fourth selecting signal SEL4 are reset to zero.

When the testing signal TM is in the high voltage level, the controller 510 decodes the external selecting signals A<2:1> to the internal selecting signals SEL<4:1>. When the testing signal TM transitions from the high voltage level to the low voltage level, the controller 510 outputs the decoded internal selecting signals SEL<4:1>. When the testing signal TM is in the low voltage level, the controller 510 keeps the internal selecting signals SEL<4:1> in the previous state, no matter what the external selecting signals A<2:1> are.

Figure 7:
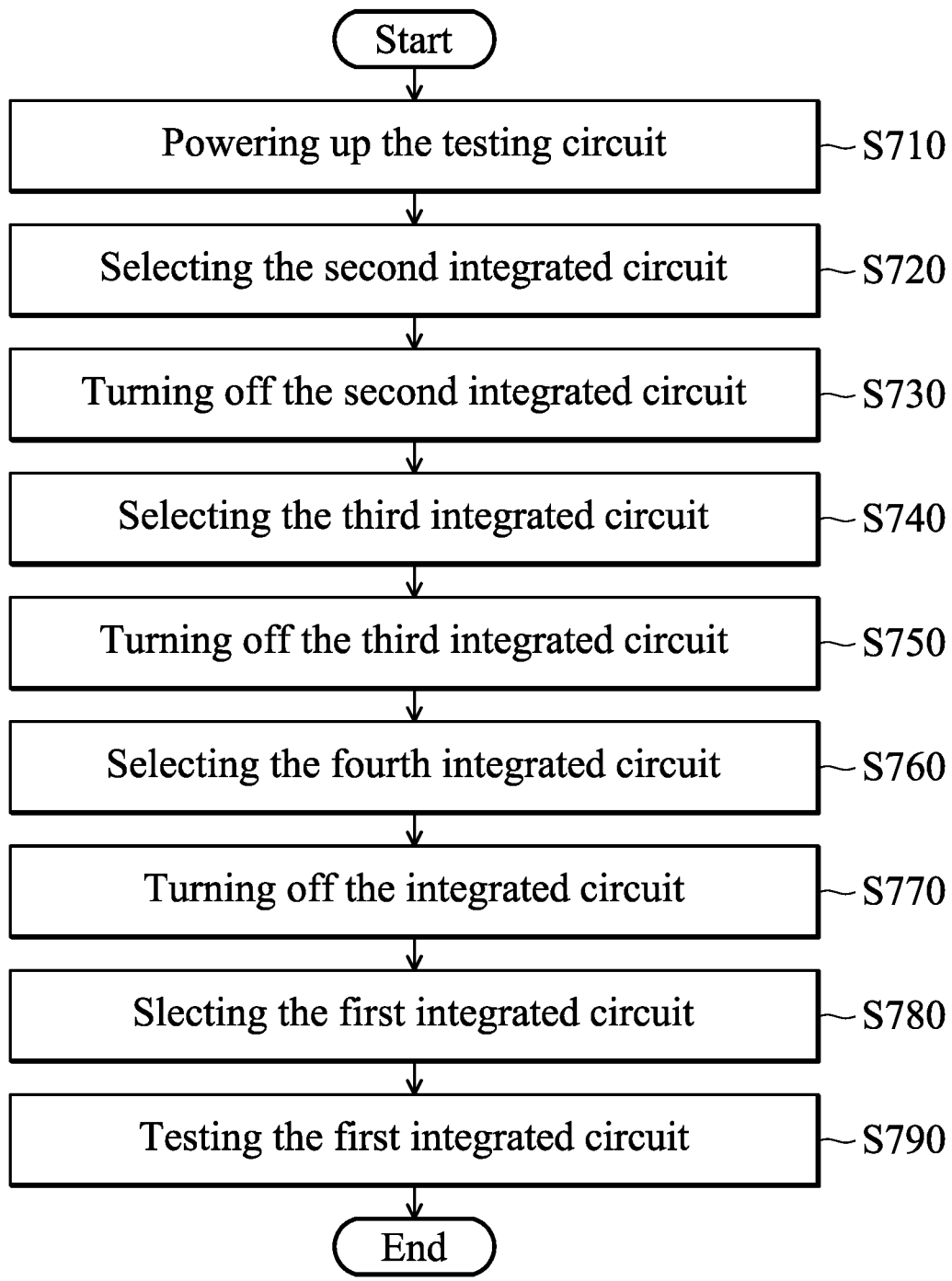
FIG. 7 is a flow chart of a testing method in accordance with an embodiment of the invention.
Figure 8:
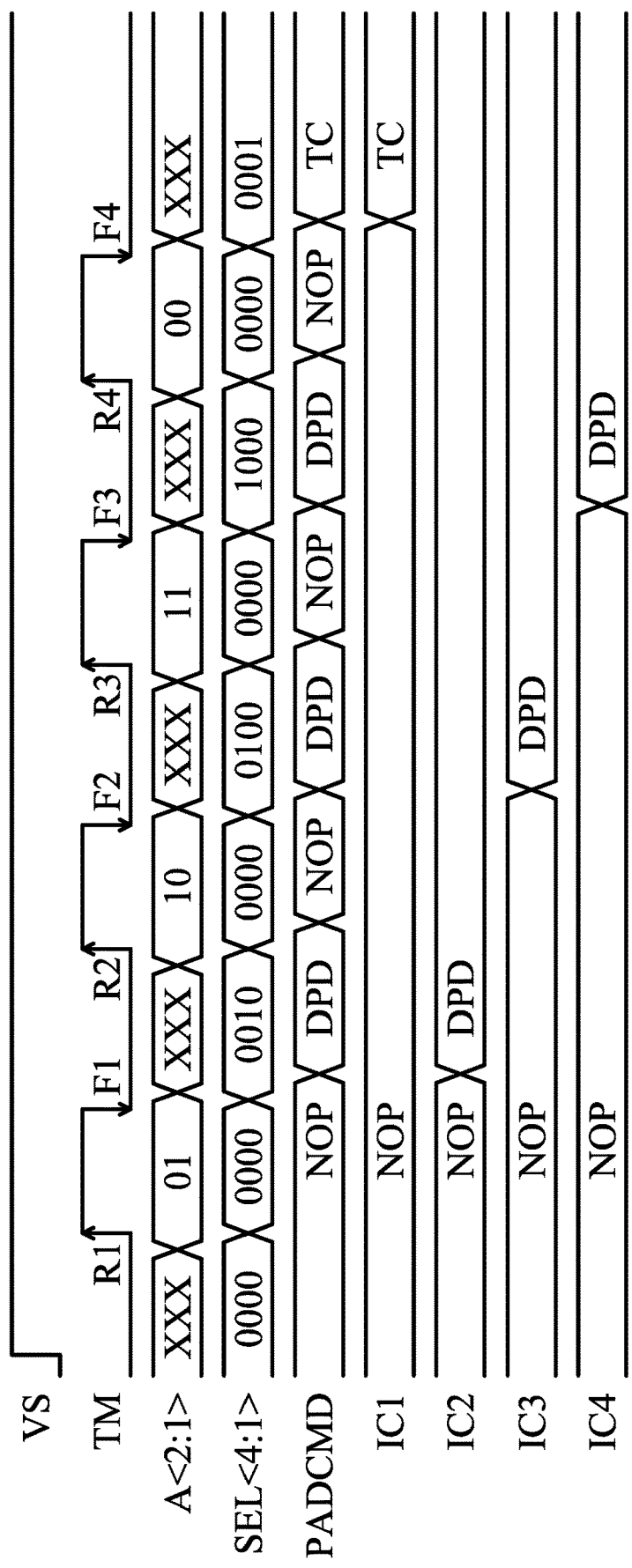
FIG. 8 is a timing diagram of a testing method in accordance with an embodiment of the invention.

FIG. 7 is a flow chart of a testing method in accordance with an embodiment of the invention. FIG. 8 is a timing diagram of a testing method in accordance with an embodiment of the invention. The following description of the flow chart in FIG. 7 will be discussed with reference to FIG. 2, FIG. 5, and FIG. 8 for a detailed explanation.

First, the testing circuit 200 is powered up (Step S710). As shown in FIG. 8, when the testing circuit 200 is powered, the supply voltage VS transitions from the low voltage level to the high voltage level to power up the testing circuit 200, and the testing signal TM keeps in the low voltage level. Even though the command pad PADCMD receives the no-operation command NOP at the same time, any one of the first integrated circuit IC1, the second integrated circuit IC2, the third integrated circuit IC3, and the fourth integrated circuit IC4 can't be input any command.

Then, the second integrated circuit IC2 is selected (Step S720). As shown in FIG. 8, when a first rising edge R1 is generated at the testing signal TM, the external selecting signals A<2:1> are 01, and the controller 510 decodes the external selecting signals A<2:1> and simultaneously resets the internal selecting signals SEL<4:1> to zero. When a first falling edge F1 is generated at the testing signal TM, the controller 510 outputs the decoded external selecting signals A<2:1> to the internal selecting signals SEL<4:1> to be 0010, so that the command pad PADCMD in FIG. 2 is coupled to the second integrated circuit IC2.

According to an embodiment of the invention, the first latch LTCH1, the second latch LTCH2, the third latch LTCH3, and the fourth latch LTCH4 in FIG. 2 latch the first internal selecting signal SEL1, the second internal selecting signal SEL2, the third internal selecting signal SEL3, and the fourth internal selecting signal SEL4 respectively, according to the testing signal TM.

The second integrated circuit IC2 is turned off (Step S730). When the command pad PADCMD receives the deep-power-down command DPD and provides the deep-power-down command DPD to the second integrated circuit IC2, the second integrated circuit IC2 operates in the deep-power-down mode according to the deep-power-down command DPD. According to an embodiment of the invention, when the second integrated circuit IC2 operates in the deep-power-down mode, the input/output bus of the second integrated circuit IC2 is in the high impedance state, and the power pin of the second integrated circuit IC2 is turned off as well.

The third integrated circuit IC3 is selected (Step S740). As shown in FIG. 8, when the second rising edge R2 is generated at the testing signal TM, the external selecting signals A<2:1> are 10, and the controller 510 decodes the external selecting signals A<2:1> and resets the internal selecting signals SEL<4:1> to zero. When the second falling edge F2 is generated at the testing signal TM, the controller 510 outputs the decoded external selecting signals A<2:1> to the internal selecting signals SEL<4:1> to be 0100, so that the command pad PADCMD in FIG. 2 is coupled to the third integrated circuit IC3.

The third integrated circuit IC3 is turned off (Step S750). When the command pad PADCMD receives the deep-power-down command DPD and provides the deep-power-down command DPD to the third integrated circuit IC3, the third integrated circuit IC3 operates in the deep-power-down mode according to the deep-power-down command DPD. According to an embodiment of the invention, when the third integrated circuit IC3 operates in the deep-power-down mode, the input/output bus of the third integrated circuit IC3 is in the high impedance state, and the power pin of the third integrated circuit IC3 is turned off as well.

The fourth integrated circuit IC4 is selected (Step S760). As shown in FIG. 8, when the third rising edge R3 is generated at the testing signal TM, the external selecting signals A<2:1> are 11, and the controller 510 decodes the external selecting signals A<2:1> and resets the internal selecting signals SEL<4:1>. When the third falling edge F3 is generated at the testing signal TM, the controller 510 outputs the decoded external selecting signals A<2:1> to the internal selecting signals SEL<4:1> to be 1000, so that the command pad PADCMD in FIG. 2 is coupled to the fourth integrated circuit IC4.

The fourth integrated circuit IC4 is turned off (Step S770). When the command pad PADCMD receives the deep-power-down command DPD and provides the deep-power-down command DPD to the fourth integrated circuit IC4, the fourth integrated circuit IC4 operates in the deep-power-down mode according to the deep-power-down command DPD. According to an embodiment of the invention, when the fourth integrated circuit IC4 operates in the deep-power-down mode, the input/output bus of the fourth integrated circuit IC4 is in the high impedance state, and the power pin of the fourth integrated circuit IC4 is turned off as well.

The first integrated circuit IC1 is selected (Step S780). As shown in FIG. 8, when the fourth rising edge R4 is generated at the testing signal TM, the external selecting signals A<2:1> are 00, and the controller 510 decodes the external selecting signals A<2:1> and resets the internal selecting signals SEL<4:1>. When the fourth falling edge F4 is generated at the testing signal TM, the controller 510 outputs the decoded external selecting signals A<2:1> to the internal selecting signals SEL<4:1> to be 0001, so that the command pad PADCMD is coupled to the first integrated circuit IC1.

The first integrated circuit IC1 is tested (Step S790). When the command pad PADCMD is coupled to the first integrated circuit IC1 and the command pad PADCMD receives the testing command TC, the first integrated circuit IC1 operates according to the testing command TC.

As stated above, the testing method 700 turns off (N−1) integrated circuits coupled to the command pad PADCMD and performs the testing operation on the rest one of the integrated circuits. In addition, the pads that are required for testing are located on the scribe line, in order to lower the influence to the operations of the integrated circuits.

Figure 9:
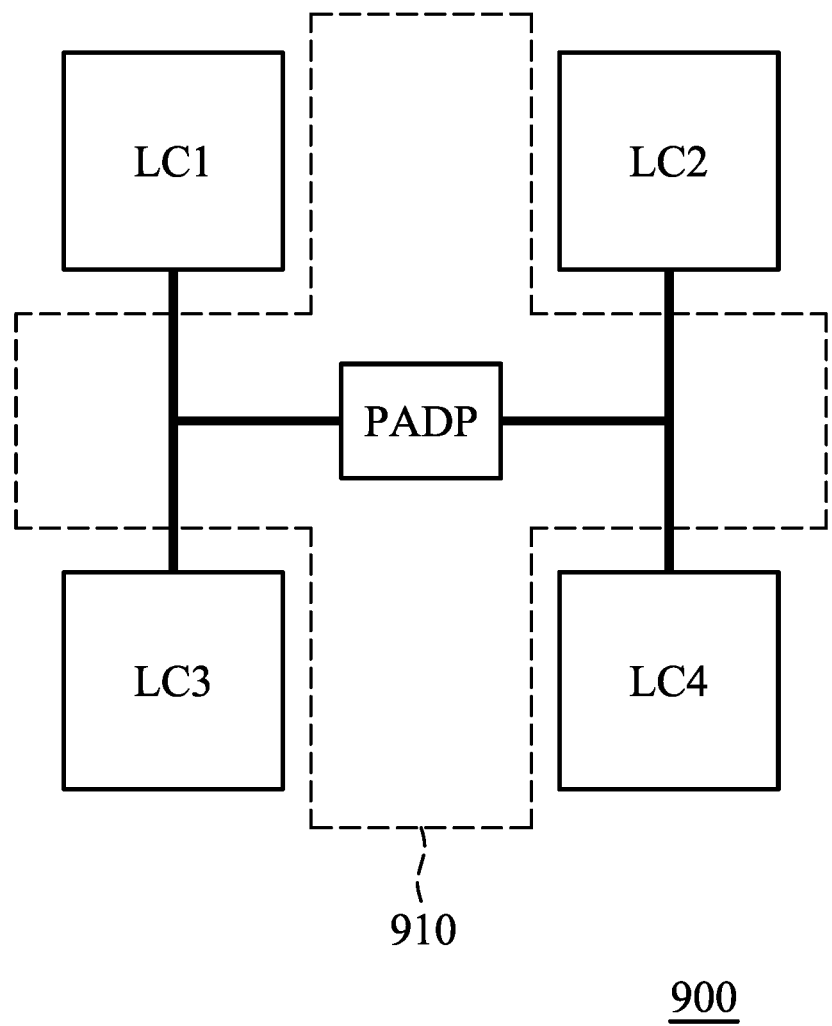
FIGS. 9-10 are schematic diagrams of testing circuits in accordance with different embodiments of the invention.

FIG. 9 is a schematic diagram of a testing circuit in accordance with an embodiment of the invention. As shown in FIG. 9, the testing circuit 900 includes a power pad PADP, a first integrated circuit IC1, a second integrated circuit IC2, a third integrated circuit IC3, and a fourth integrated circuit IC4. The power pad PADP is configured to receive the power and provides the power to the first integrated circuit IC1, the second integrated circuit IC2, the third integrated circuit IC3, and the fourth integrated circuit IC4 at the same time.

According to other embodiments of the invention, the testing circuit 900 may include a plurality of power pad PADP, and only one power pad PADP is illustrated herein, but not intended to be limited thereto. As shown in FIG. 9, there is a scribe line 910 among the first integrated circuit IC1, the second integrated circuit IC2, the third integrated circuit IC3, and the fourth integrated circuit IC4, in which the power pad PADP is located on the scribe line 910. When the first integrated circuit IC1, the second integrated circuit IC2, the third integrated circuit IC3, and the fourth integrated circuit IC4 are cut into single chips, the power pad PADP is cut off as well so as to reduce the influence of the power pad PADP to the normal operation of each of the integrated circuits.

Figure 10:
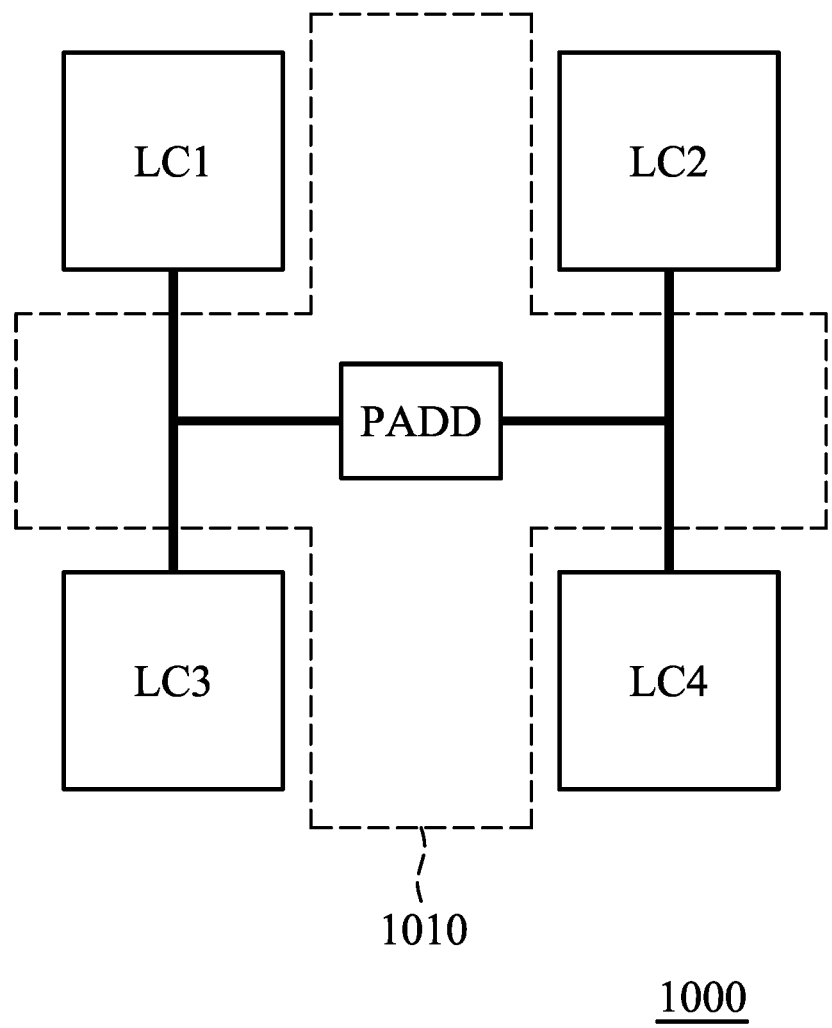

FIG. 10 is a schematic diagram of a testing circuit in accordance with another embodiment of the invention. As shown in FIG. 10, the testing circuit 1000 includes a data pad PADD, a first integrated circuit IC1, a second integrated circuit IC2, a third integrated circuit IC3, and a third integrated circuit IC4. The data pad PADD is coupled to the first integrated circuit IC1, the second integrated circuit IC2, the third integrated circuit IC3, and the fourth integrated circuit IC4. The data pad PADD, which is coupled to the first integrated circuit IC1, the second integrated circuit IC2, the third integrated circuit IC3, and the fourth integrated circuit IC4, is configured to transmit the data to one of the integrated circuit IC1, the second integrated circuit IC2, the third integrated circuit IC3, and the fourth integrated circuit IC4 and to receive the data transmitted from one of the integrated circuit IC1, the second integrated circuit IC2, the third integrated circuit IC3, and the fourth integrated circuit IC4.

According to other embodiments of the invention, the testing circuit 1000 may include a plurality of data pad PADD, and only one data pad PADD is illustrated herein, but not intended to be limited thereto. As shown in FIG. 10, there is a scribe line 1010 among the first integrated circuit IC1, the second integrated circuit IC2, the third integrated circuit IC3, and the fourth integrated circuit IC4, in which the data pad PADD is located on the scribe line 1010. When the first integrated circuit IC1, the second integrated circuit IC2, the third integrated circuit IC3, and the fourth integrated circuit IC4 are cut into single chips, the data pad PADD is cut off as well so as to reduce the influence of the data pad PADD to the normal operation of each of the integrated circuits.

The testing circuits and the testing methods thereof are provided herein. All pads that are required for testing are located on the scribe line so as to reduce the influence of the testing pads on the normal operation of the integrated circuits. In addition, a latch is inserted into the command pad and each integrated circuit, thereby transmitting the operation command to the corresponding integrated circuit through enabling the latch. Therefore, a plurality of integrated circuits are able to share a common command pad so as to reduce the number of pads required for testing. Furthermore, a plurality of integrated circuits may share the same power pads and data pads, further reducing the number of pads required for testing.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure.

What is claimed is:

1. A testing circuit, comprising:
   a command pad, receiving an operation command;
   a first integrated circuit, performing a corresponding testing operation according to the operation command and an internal selecting signal;
   a second integrated circuit, performing the corresponding testing operation according to the operation command and the internal selecting signal;
   a first latch, providing the operation command to the first integrated circuit according to the internal selecting signal; and
   a second latch, providing the operation command to the second integrated circuit according to the internal selecting signal.

2. The testing circuit as defined in claim 1, wherein the command pad, the first latch, and the second latch are located on the scribe line between the first integrated circuit and the second integrated circuit.

3. The testing circuit as defined in claim 1, further comprising:
   a testing pad, receiving a testing signal;
   an external selecting pad, receiving an external selecting signal; and
   a controller, decoding the external selecting signal into the internal selecting signal according to the testing signal.

4. The testing circuit as defined in claim 3, wherein when the testing signal transitions from a first state to a second state, the controller resets the internal selecting signal, wherein when the testing signal transitions from the second state to the first state, the controller decodes the external selecting signal into the internal selecting signal, wherein the internal selecting signal is configured to select the first integrated circuit or the second integrated circuit to perform the corresponding operation.

5. The testing circuit as defined in claim 4, wherein when the testing signal transitions from the second state to the first state, the controller decodes the external selecting signal to the internal selecting signal, and the latch provides a deep-power-down command received by the command pad to the first integrated circuit according to the internal selecting signal generated by the controller so as to operate the first integrated circuit in a deep-power-down mode.

6. The testing circuit as defined in claim 5, wherein when the first integrated circuit operates in the deep-power-down mode, the controller provides a testing command received by the command pad to the second integrated circuit according to the external selecting signal so that the second integrated circuit performs the corresponding testing operation according to the testing command.

7. The testing circuit as defined in claim 4, wherein the first state is a low voltage level, and the second state is a high voltage level.

8. The testing circuit as defined in claim 1, wherein the testing pad and the controller are located on a scribe line between the first integrated circuit and the second integrated circuit.

9. The testing circuit as defined in claim 1, further comprising:
   a plurality of power pads, receiving power, coupled to the first integrated circuit and the second integrated circuit, and configured to power the first integrated circuit and the second integrated circuit, wherein each of the power pads is located on a scribe line between the first integrated circuit and the second integrated circuit.

10. The testing circuit as defined in claim 1, further comprising:
    a plurality of data pads, coupled to the first integrated circuit and the second integrated circuit, configured to transmit data to the first integrated circuit or the second integrated circuit, and configured to receive the data transmitted from the first integrated circuit or the second integrated circuit, wherein each of the data pads is located on a scribe line between the first integrated circuit and the second integrated circuit.

11. A testing method adapted to test a first integrated circuit and a second integrated circuit, comprising:
    selecting the first integrated circuit;
    operating the first integrated circuit in a deep-power-down mode;
    selecting the second integrated circuit; and
    performing a corresponding testing operation on the second integrated circuit according to a testing command.

12. The testing method as defined in claim 11, wherein the step of selecting the second integrated circuit and the step of selecting the first integrated circuit further comprise:
    receiving a testing signal through a testing pad;
    receiving an external selecting signal through an external selecting pad;
    decoding the external selecting signal into the internal selecting signal according to the testing signal; and selecting the first integrated circuit or the second integrated circuit, according to the internal selecting signal.

13. The testing method as defined in claim 12, wherein the testing pad is located on a scribe line between the first integrated circuit and the second integrated circuit.

14. The testing method as defined in claim 12, wherein the step of decoding the external selecting signal into the internal selecting signal according to the testing signal further comprises:

when the testing signal transitions from a first state to a second state, resetting the internal selecting signal; and when the testing signal transitions from the second state to the first state, decoding the external selecting signal into the internal selecting signal.

15. The testing method as defined in claim 14, wherein the first state is a low voltage level and the second state is a high voltage level.

16. The testing method as defined in claim 12, wherein the step of operating the first integrated circuit in the deep-power-down mode further comprises:

receiving, by a command pad, a deep-power-down command;

providing, by a first latch, the deep-power-down command to the first integrated circuit according to the internal selecting signal; and operating the first integrated circuit in the deep-power-down mode according to the deep-power-down command.

17. The testing method as defined in claim 16, wherein before the step of performing a corresponding testing operation on the second integrated circuit, the testing method further comprises:

receiving, by the command pad, the testing command; and providing, by a second latch, the testing command to the second integrated circuit according to the internal selecting signal.

18. The testing method as defined in claim 17, wherein the command pad, the first latch, and the second latch are located on a scribe line between the first integrated circuit and the second integrated circuit.

19. The testing method as defined in claim 11, further comprising:

receiving a power by a plurality of power pads, wherein the power pads are coupled to the first integrated circuit and the second integrated circuit and located on a scribe line between the first integrated circuit and the second integrated circuit; and powering the first integrated circuit and the second integrated circuit with the power.

20. The testing method as defined in claim 11, further comprising:

transmitting data, from a plurality of data pads, to the first integrated circuit or the second integrated circuit; and receiving data, by the data pads, transmitted from the first integrated circuit or the second integrated circuit, wherein each of the data pads is coupled to the first integrated circuit and the second integrated circuit and located on a scribe line between the first integrated circuit and the second integrated circuit.

* * * * *